(12) United States Patent
Bühler

(10) Patent No.: US 9,194,736 B2
(45) Date of Patent: Nov. 24, 2015

(54) METHOD OF ESTIMATING THE ELECTROSTATIC FORCE ON AN OBJECT TO BE WEIGHED BY APPLYING CHARGES OF OPPOSITE POLARITY TO ALTERNATING ELECTRODES AND MEASURING THE RESULTANT FORCES

(71) Applicant: Mettler-Toledo AG, Greifensee (CH)

(72) Inventor: Stefan Bühler, Nänikon (CH)

(73) Assignee: Mettler-Toledo AG, Greifensee (CH)

( * ) Notice: Subject to any disclaimer, the term of this patent is extended or adjusted under 35 U.S.C. 154(b) by 154 days.

(21) Appl. No.: 14/159,081

(22) Filed: Jan. 20, 2014

(65) Prior Publication Data
US 2014/0202775 A1    Jul. 24, 2014

(30) Foreign Application Priority Data
Jan. 22, 2013  (EP) .................................... 13152156

(51) Int. Cl.
| | |
|---|---|
| G01G 9/00 | (2006.01) |
| H01L 21/66 | (2006.01) |
| G01G 23/01 | (2006.01) |
| G01G 23/14 | (2006.01) |
| G01G 21/28 | (2006.01) |
| G01G 23/00 | (2006.01) |

(52) U.S. Cl.
CPC ................ *G01G 21/28* (2013.01); *G01G 23/00* (2013.01); *G01G 23/01* (2013.01); *G01G 9/00* (2013.01); *G01G 23/14* (2013.01); *H01L 22/12* (2013.01)

(58) Field of Classification Search
CPC ......... G01G 9/00; G01G 21/28; G01G 23/00; G01G 23/01; G01G 23/14; H01L 22/12
See application file for complete search history.

(56) References Cited

U.S. PATENT DOCUMENTS

| | | | |
|---|---|---|---|
| 5,332,870 A | 7/1994 | Strickler | |
| 6,515,238 B1 | 2/2003 | Martens et al. | |
| 7,323,645 B2 | 1/2008 | Nufer et al. | |
| 8,683,880 B2 * | 4/2014 | Wilby | 73/865 |

FOREIGN PATENT DOCUMENTS

EP          1813920 A1 *  8/2007  ............. G01G 21/28

* cited by examiner

*Primary Examiner* — Randy W Gibson
(74) *Attorney, Agent, or Firm* — Standley Law Group LLP

(57) ABSTRACT

A method estimates the effect on the weighing result of a balance (1) that is caused by electrostatic charges on an object (2) received on a load receiver (6) thereof. A first predefined positive voltage ($U_1$) and a second predefined negative voltage ($U_2$) of equal magnitude are alternatingly applied to a first electrode (12) in the vicinity of the weighing object. The forces acting on a force-measuring cell (17) are measured and are registered as the first and second measurement results. The difference between the respective measurement results represents the magnitude of the influence that the electrostatic charges residing on the weighing object are having on the weighing result. The difference also represents an essentially proportional part of the force resulting from electrostatic charges on the weighing object which causes a change in the weighing result and is sent as a signal to a processor unit.

18 Claims, 3 Drawing Sheets

METHOD OF ESTIMATING THE ELECTROSTATIC FORCE ON AN OBJECT TO BE WEIGHED BY APPLYING CHARGES OF OPPOSITE POLARITY TO ALTERNATING ELECTRODES AND MEASURING THE RESULTANT FORCES

CROSS-REFERENCE TO RELATED APPLICATIONS

This application is entitled to benefit of a right of priority under 35 USC §119 from European patent application 13152156.9, filed 22 Jan. 2013, the content of which is incorporated by reference as if fully recited herein.

TECHNICAL FIELD

The invention concerns a method of estimating the extent to which the weighing result of a balance is influenced by electrostatic charges of a weighing object. In addition, the invention also concerns a balance with the capability to perform the method.

BACKGROUND

When objects have to be weighed with high precision, one needs to minimize as much as possible all factors that have an influence on the weighing result. This includes for example air drafts which can in most cases be reduced sufficiently by means of a draft shield so that they can be ignored, or fluctuations of the ambient conditions, including temperature and humidity, which can be eliminated for example by placing the balance in a climate-controlled environment.

Another factor affecting the weighing result is the presence of electrostatic charges in the weighing compartment, specifically in the vicinity of, or directly on, the weighing object, which manifest themselves particularly when samples are weighed that are non-conductive or are contained in vessels of non-conductive material. The effect of electrostatic charges poses a big problem in particular when large glass- or polymer containers are used in situations where the weighing task involves the determination of small mass differences. In most cases, there is no build-up of electrostatic charges on the load receiver itself on which the samples and/or containers that make up the weighing load are placed, since the load receiver is normally made of metal, and the charges can drain off through a conductive connection to the electrically grounded balance housing.

A build-up of electrostatic charges on the weighing load on the load receiver gives rise to a difference in the respective electrostatic potentials of the weighing load and the grounded parts of the balance. Due to this difference in electrostatic potentials, there will be a force acting between the weighing load and, e.g., the floor of the weighing compartment. The vertical component of this force will also act on the weighing cell, in addition to the weight force generated by the weighing object. Consequently, an incorrect weighing result will be produced and displayed.

For example when a sample is weighed in a plastic vessel, electrostatic charges can cause a measurement error of 2 milligrams. For a sample of 20 milligrams, the measurement error can thus be as high as 10% of the weight of the sample.

Other balance parts such as for example an added draft shield or other areas of the housing, to the extent that they consist of non-conductive materials, can likewise accumulate electrostatic charges and introduce errors in the weighing result through a so-called force bypass.

An analytical balance designed to weigh electrostatically charged weighing objects is described in EP 1 106 978 A1. The balance, which has a draft shield, is equipped with a device for generating a stream of ionized air. This device includes an air ionizer with at least two pinpoint electrodes held at respective voltages of opposite polarity, as well as a fan. The device can be activated by the closing of the draft shield access openings and can be turned off after a preset time period has elapsed.

This device has on the one hand the disadvantage that the fan can produce unwanted air drafts in the area of the load receiver, and on the other hand that there is always a fixed amount of ionized air molecules available to neutralize the electrostatic charges, regardless of the magnitude of the electrostatic charge accumulated by the object on the load receiver.

A balance with an electrostatic charge sensor to detect the presence of electrostatic charges and to provide a signal representative of the amount of the built-up charges is disclosed in EP 1 813 920 A1. The balance, which includes a load receiver for the weighing object and an electronic part with a measuring module, is equipped with an electrostatic sensor that is arranged in such a way that electrostatic charges on an object that is placed, or about to be placed, on the load receiver can be detected.

While the spread of electrostatic charges is continuous, they are not uniformly distributed in space. Their concentration and polarity are different for each material. This means that the charges detected with the arrangement of EP 1 813 920 A1 are predominantly in the vicinity of the electrostatic sensor. The measurement result of the electrostatic sensor depends on the specific location where the sensor is located in the balance. The information gained from the measurement of electrostatic charges with an electrostatic sensor therefore has only limited validity.

As a further disadvantage, the electrostatic sensor measures the magnitude of the electrostatic charge independently of the direction of the forces originating from them. In a balance, only the vertical components of the electrostatic attraction forces have an influence on the weighing result, and it is also essential in which direction the vertical force pulls the weighing object, i.e. upward or downward. The measurement of the total electrostatic charge that is present in the vicinity of the electrostatic sensor is therefore irrelevant.

Furthermore, this balance requires the use of an additional sensor besides the weighing cell.

It is therefore the object of the present invention to propose a method and a device which will make it possible to estimate the extent to which the weighing result of a balance is influenced by electrostatic charges that are present on a weighing object. The aim is for a solution with a minimum of additional electronic circuitry.

SUMMARY

This task is accomplished with a method according to the independent methods claim and with apparatus features according to the primary apparatus claim.

A balance is equipped with a force-measuring cell and with a load receiver designed to support an object that is to be weighed. The method of estimating the influence that electrostatic charges on the weighing object have on the weighing result of the balance entails the following steps:

while a first predefined positive voltage and a second predefined negative voltage are alternatingly applied to a first electrode which is arranged in the vicinity of the weighing object;

the forces acting on the force-measuring cell, respectively, during application of said first voltage and during application of said second voltage are measured and said measurements are registered as the first measurement result and the second measurement result; wherein the difference between the first and the second measurement result represents the magnitude of the influence that the electrostatic charges residing on the weighing object are having on the weighing result; and the difference between the first and the second measurement result, which represents an essentially proportional part of the force resulting from electrostatic charges on the weighing object and causes a change in the weighing result, is sent as an input signal to a processor unit.

The method is used typically in analytical balances and microbalances. The electrode is arranged in the vicinity of the weighing object; it is not in contact with the weighing object and is part of the balance. As a result of the predefined positive voltage that is applied to the first electrode, the electrode will become positively charged and, consequently, a difference in potential and an electric field will establish themselves between the weighing object and the electrode. As a result of the electric field, a force will be acting between the weighing object and the electrode. The spatial arrangement of the electrode in relation to the weighing object is such that the electric field has an influence on the weighing result.

If the weighing object carries a positive charge, the electrode and the weighing object will mutually repel each other as they have the same polarity. On the other hand, if the weighing object carries a negative charge, an attractive force will be acting between the weighing object and the positively charged electrode. The vertical component of this force superimposes itself on the weight force and thus causes a change in the weighing result.

If the electrode is arranged below the weighing object and the weighing object is attracted by the electrode, the electrostatic force acts as an addition to the weight force. Conversely, if the electrode is arranged above the weighing object and exerts an attractive force on the weighing object, the resultant force acting on the force measuring cell represents the difference between the weight force and the absolute amount of the electrostatic force.

Accordingly, it is possible to determine the polarity of the electrostatic charges on the weighing object from the polarity of the applied voltage, the position of the electrode in relation to the weighing object and the direction (positive or negative) of the change of the weighing result.

The force acting on the force-measuring cell is measured and stored in memory as the first weighing result.

Next, a second predefined negative voltage is applied to the electrode. Due to the polarity change of the electrostatic charges on the electrode, the electrostatic force will act in the opposite direction. If the positive voltage caused an attractive force between electrode and weighing object, the negative voltage on the electrode will cause a repulsive force, and vice versa. Accordingly, the weighing result will be either larger or smaller.

The force acting on the force-measuring cell is measured and stored in memory as the second weighing result.

The larger the electrostatic charge residing on the weighing object, the larger will be the electrostatic force acting on the weighing object and the more the weighing result will deviate from the actual weight.

The larger the applied voltage, the stronger will be the change in the weighing result if electrostatic charges are present on the weighing object. This means that the sensitivity of the measurement method will be increased. It is possible to work with different voltage levels which are selected dependent on the weighing object, the material of the weighing object, or the size of the weighing object. It has been found that a voltage from 50 to 100 V provides a sufficiently high sensitivity.

The voltage applied to the electrode can be fixed or variable. For example, it could be controlled in such a way that during a first pulse period, the voltage rises up to a level where an influence on the weight measurement is detected, and that the same voltage level is maintained for the subsequent pulse periods. For the difference between the first and the second measurement result to be meaningful, the first and second predefined voltages have to be equal in absolute magnitude and of opposite polarity. The voltages applied to the electrodes can for example have the form of a symmetrical rectangular or sinusoidal pulse signal.

As the weight changes are measured by the force-measuring cell, the sensitivity of the estimate also depends on the resolution of the balance. The more sensitive the balance, the higher will be the accuracy of the measurement of the weight change that occurs when the voltage is applied to the electrode.

In the next step, the difference between the first and the second measurement result is calculated and delivered as an output of a processor unit.

The difference between the first and the second measurement result indicates the magnitude of the influence that the electrostatic charges on the weighing object have on the weighing result. The difference is essentially proportional to the force which is caused by the electrostatic charges and which, in turn, causes a change in the weighing result.

Since it is not the absolute amount but rather the change of the weighing result that is of interest in this method, the method according to claim 1 can be performed immediately after a sample is placed on the balance, i.e. during the initial transient oscillations of the balance. This allows the measurement result to be delivered faster, without additional waiting time for the user.

The method is preferably performed automatically after a weight change has been detected by the balance. Thus, the method is started with the assumption that a new weighing object with an unknown electric charge is present on the load receiver.

It is further preferred if the weight changes caused by performing the method are not shown in the display of the balance in order to avoid confusion for the user of the balance.

The frequency of the voltage applied to the electrode can be selected within a certain range. It has been found that the force-measuring cell can adequately follow weight changes with a frequency between 2 and 10 Hz. Ideally, the transfer function of the force-measuring cell is very fast and the pulses are sufficiently long that the force-measuring cell is still just able to follow the weight changes. Typically, the weight measurement is synchronized with the voltage applied to the electrode.

For the simultaneous processing of the measurement signal while the method is being performed it is preferred to use a parallel filter path for the signal processing in order to filter out signals of the frequency used for the voltage supply of the electrode. Ideally, the so-called chopper technique is used for this purpose, as it allows a particularly interference-resistant measurement.

One advantage of the invention lies in the fact that it can be realized with the electronic system that is normally used in a balance without any additional components except for the voltage supply of the electrodes, and without the use of additional sensors. This means that no additional heat source is introduced in the existing balance. Furthermore, the manufacturing costs of the balance are increased only to an insignificant extent by adding the device for determining the influence of electrostatic charges.

In one embodiment of the invention, the algebraic sign of the difference between the first and the second measurement result indicates the polarity of the electrostatic charges carried by the weighing object.

In a further developed application of the invention, the processor unit sends at least one output signal to an indicator unit and/or an ionizer.

According to a further preferred aspect of the invention, the at least one output signal from the processor includes polarity and/or magnitude, wherein the value for the magnitude is proportional to the amount of the difference between the first and second measurement result.

In a further embodiment, the at least one processor signal includes information about the measures to be taken to drain off the charge and/or to screen the weighing object.

A further preferred element in implementing the inventive method is to correct the weighing result by applying a predefined correction factor and the difference between the first and second measurement result.

Knowing the polarity of the electrostatic charges residing on the weighing object has the advantage that the user can take targeted measures to remove the electrostatic charges. For example, based on the indicated polarity the user can spray the weighing object with ions of the opposite polarity by means of an ionizer. The ionizer can be arranged inside or outside of the balance. It is advantageous, if the ionizer is controlled by the processor unit.

The amount of the difference between the first and the second measurement result can be used to control the intensity and duration of the de-ionization. The relationship that determines the intensity and duration of the de-ionization based on the difference between the first and the second measurement result can be found empirically.

It is advantageous if the position, the dimension, the material and the form of the weighing object are held constant over the course of a measurement series. This ensures that the weighing takes place under consistent measurement conditions. The influence of the electrostatic charges can thus be estimated more accurately, and the measurement error can be compensated through an empirical procedure.

Preferably, the weighing result on the indicator unit is not displayed during the time period when the method is being performed. Thus, the user is spared the irritation of a changing indication. Besides, it is better if the indicator displays the weighing result only after the method has been performed.

According to a further embodiment, status information is signaled to the user, wherein the status signal indicates a current status of the method, differentiating at least between a first status "method according to claim 1 in process" and a second status "method according to claim 1 completed".

This function offers the advantage that the user is informed about the activity of the balance and about the validity of the displayed weight. Thus, he will disregard the displayed weighing result while the method according to claim 1 is in process. After the method has been completed, the user can rely on the status signal to either continue the normal operation of the balance or to take measures for the removal of the electrostatic charges.

With preference, a fixed element of the balance is arranged in the vicinity of the weighing object or the load receiver, wherein said fixed element forms the first electrode. The fixed element can be constituted for example by the floor of the weighing compartment, the roof of the draft shield, or a wall of the draft shield.

According to a further embodiment, the balance has a first electrode and at least a second electrode, wherein each of the electrodes is of a planar shape.

The sensitivity of the method is enhanced in particular if the first electrode is arranged below the weighing object and the second electrode is arranged above the weighing object and the two electrodes are charged with opposite voltages.

It is particularly advantageous if a balance is configured so that the first or the second electrode is arranged below the weighing object and the load receiver. In this way, as the distance between the weighing object and the electrode is minimized, the forces will normally be largest and the sensitivity of the measurement method will accordingly be maximized.

In a preferred embodiment, the electrode below the weighing object and the load receiver has a cutout with the contour shape of the vertical projection of the load carrier onto the floor of the weighing compartment. The cutout has the purpose to limit the force measurement as much as possible to the electrostatic charges that are present on the weighing object and to avoid setting up an electrostatic field, and thus an electrostatic force, between the electrically grounded load receiver and the electrode.

The first electrode is preferably arranged so that it extends orthogonal to the direction of gravity and the at least one second electrode is arranged either orthogonal to the direction of gravity or in the direction of gravity.

It is advantageous if the balance has a weighing compartment floor and/or a draft shield roof and/or draft shield walls which are used either in their entirety or in part as the first and/or the at least one second electrode. Thus, the method does not require the addition of any apparatus features except a controllable voltage supply for the one or more electrodes.

The apparatus components called for by the invention, which are named above and in the claims and described hereinafter in the examples of embodiments, are not subject to any special and exceptional requirements regarding their size, shape, design, material, and technical concept and can thus be specified freely according to selection criteria that are generally known in this area of application.

BRIEF DESCRIPTION OF THE DRAWINGS

Further details, characteristic features and advantages of the subject of the invention can be found in the dependent claims and also in the following description of the attached drawings, wherein a preferred embodiment of the invention is presented as an example, and wherein:

DETAILED DESCRIPTION

Figure 1:
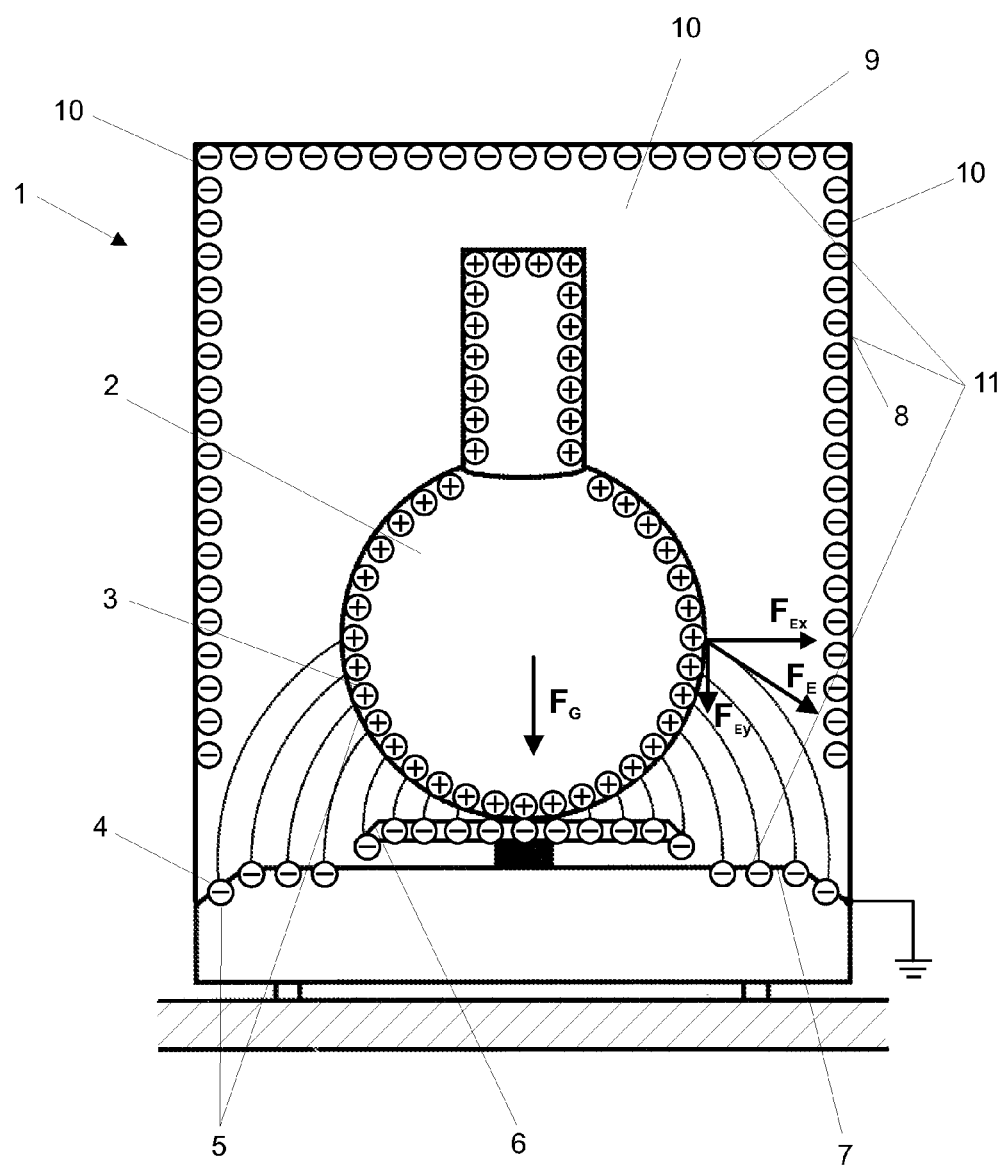
FIG. 1 is a side view of a balance with a draft shield and with an electrostatically charged weighing object.

FIG. 1 represents a balance 1 with a draft shield 8. A weighing object 2 rests on the load receiver 6. The weighing object 2 carries a positive electrostatic charge, which means that the surface of the weighing object 2 has a deficit of electrons. The parts in the vicinity of the weighing object 2, i.e. the load receiver 6, the weighing compartment floor 7, the draft shield walls 10 as well as the draft shield roof 9 are negatively polarized at their surfaces as a result of electrostatic induction. They have a surplus of electrons on their surfaces.

Electron surpluses and deficits are the result of an electron exchange between atoms of two objects that consist of non-conductive materials. The electron exchange occurs typically as a result of frictional contact between the two objects. Thus, when a weighing object 2 or a part of the balance is handled by a person and/or with tools that are not electrically grounded, this will give rise to electrostatic charges 3, 5 on the weighing object 2 and/or on parts of the balance that are not connected to earth ground. The extent of the electron exchange depends on the materials and on how they come into contact with each other.

Excess electrons are attracted to occupy the place of missing electrons in another atom. This attraction forms an electrostatic field between the charges 3, 5 on the weighing object 2 and the charges 4, 5 on the parts of the balance. The electrostatic field is of the nature of a force field $F_E$ whose vertical component $F_{EY}$ adds itself to the gravity force $F_G$ of the weighing object 2 and thus has an influence on the weighing result.

Figure 2:
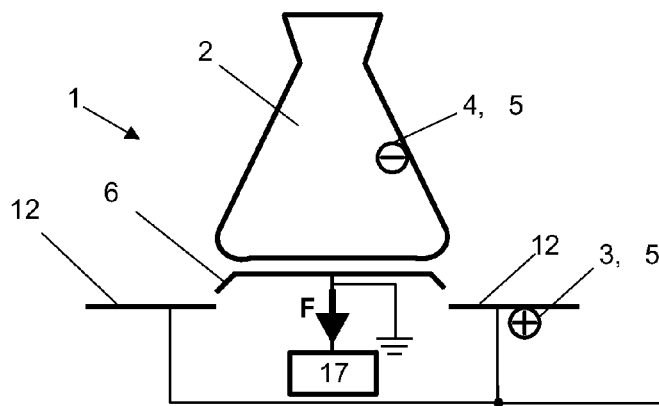
FIG. 2 is a schematically simplified side view of a balance with an electrode arranged on the floor of the weighing compartment.

FIG. 2 shows a weighing object 2 resting on a load receiver 6. The load receiver 6 is coupled to the force-measuring cell 17.

The weighing object 2 carries a negative electrostatic charge. The load receiver 6 is grounded. With a non-conductive weighing object 2, no discharge takes place through the ground connection. The charged weighing object 2 remains charged.

An electrode 12 forms the weighing compartment floor 7. A cutout in the electrode 12 with the contour shape of the vertical projection of the load receiver 6 is apparent in the drawing. The electrode 12 is connected to a DC voltage source $U_A$. When a positive DC voltage $U_1$ is applied to the electrode 12, positive charges 3 are caused to flow towards the electrode 12. The negatively charged weighing object 2, the positively charged electrode 12 and the air between them act as a capacitor. The electrostatic field causes an attraction between the weighing object 2 and the electrode 12, which acts on the weighing object 2 as a force in the direction of the electrode 12. The force-measuring cell 17 measures the sum of the gravity force and the vertical component of the electrostatic attraction.

FIG. 3A shows as an example in the form of a time graph how the claimed method is carried out by applying the voltage U to the electrode 12. $U_0$ is the voltage level of the electrode before and after the inventive method is performed and amounts to 0 Volt. $U_1$ is a positive DC voltage and $U_2$ is a negative DC voltage. $U_1$ and $U_2$ have the same absolute value.

The voltage U varies as a function of time, taking on specific values at the times $t_0$, $t_1$, $t_2$, $t_3$, $t_4$ and $t_5$, as follows:

At a point in time $t_o$ before the start of the inventive method, the electrode 12 is connected to chassis ground, i.e. $U=U_0=0$ Volt.

At the time $t_1$ the inventive method is started and the voltage U applied to the electrode 12 is set at the value of the first predefined positive voltage $U_1$.

At the time $t_2$ the voltage U applied to the electrode 12 changes from the value of the first predefined positive voltage $U_1$ to the value of the second predefined negative voltage $U_2$.

At the time $t_3$ the voltage U applied to the electrode 12 changes from the value of the second predefined negative voltage $U_2$ to the value of the first predefined positive voltage $U_1$.

At the time $t_4$ the voltage U applied to the electrode 12 changes for the second time from the value of the first predefined positive voltage $U_1$ to the value of the second predefined negative voltage $U_2$.

At the time $t_5$ the inventive method has been completed and the voltage U applied to the electrode 12 changes from the value of the second predefined negative voltage $U_2$ to the value $U_0$, wherein $U_0=0$ Volt.

FIGS. 3B, 3C, 3D and 3E illustrate the respective measurement results $m_a$, $m_b$, $m_c$, $m_d$ when different objects 2 are weighed with a voltage U being applied to the electrode 12 in accordance with the time graph 3A. In the case of FIG. 3B the weighing object carries no electrostatic charge and is not connected to earth ground, in FIG. 3C the weighing object carries a negative charge and in FIG. 3D a positive charge, and in FIG. 3E the weighing object is electrically connected to earth ground.

In FIGS. 3B to 3E, $m_{a0}$, $m_{b0}$, $m_{c0}$, $m_{d0}$ are the respective values of the measurement result before and after performing the inventive method, i.e. when the voltage U is at the level $U_0$. The values $m_{a0}$, $m_{b1}$, $m_{b2}$, $m_{c1}$, $m_{c2}$ and $m_{d1}$ represent the measurement results during the time period when the inventive method is being performed, wherein $m_{b1}$ and $m_{c1}$ are the values measured while the voltage U is at the level U1, and $m_{b2}$ and $m_{c2}$ are the values measured while the voltage U is at the level U2. The values $\Delta m_b$ and $\Delta m_c$ represent the difference between the first and the second measurement result or, respectively, between $m_{b1}$ and $m_{b2}$ and between $m_{c1}$ and $m_{c2}$.

Following is a description of the time graphs 3A, 3B, 3C, 3D and 3E during each of the time intervals that are common to all of the five graphs, which are based on an arrangement in accordance with FIG. 2, where the electrode 12 is arranged below the weighing object 2.

Time interval $t_0$-$t_1$:

3A. The electrode 12 is connected to chassis ground.

3B. The weighing object 2 carries no electrostatic charge and is not electrically connected to ground. The electrode 12 is grounded, meaning that there is neither an electrostatic field nor are there electrostatic forces. The force-measuring cell 17 measures the true mass $m_{a0}$ of the weighing object 2.

3C. The weighing object 2 carries a negative charge and the electrode 12 is grounded. The negatively charged weighing object is pulled by the electrostatic attraction forces towards the electrode 12. The result $m_{b0}$ measured by the force-measuring cell 17 represents the sum of the effective weight force of the weighing object 2 and the vertical component of the force which pulls the weighing object in the direction towards the electrode 12. The measured result is greater than the effective weight force of the weighing object 2.

3D. The weighing object 2 carries a positive charge and the electrode 12 is grounded. The positively charged weighing object is pulled by the electrostatic attraction forces towards the electrode 12. The result $m_{c0}$ measured by the force-measuring cell 17 represents the sum of the effective weight force of the weighing object 2 and the vertical component of the force which pulls the weighing object in the direction towards the electrode 12. The measured result is greater than the effective weight force of the weighing object 2.

3E. The weighing object 2 and the electrode 12 are electrically grounded, meaning that there is neither an electrostatic field nor are there electrostatic forces. The force-measuring cell 17 measures the true mass $m_{d0}$ of the weighing object 2.

Time interval $t_1$-$t_2$:

3A. A positive DC voltage $U_1$ is applied to the electrode 12.

3B. The weighing object 2 carries no electrostatic charge and is not electrically connected to ground. The electrode 12 is positively charged. There is neither an electrostatic field nor are there electrostatic forces between the weighing object and the electrode. The force-measuring cell 17 measures the true mass $m_{a0}$ of the weighing object 2.

3C. The weighing object 2 carries a negative charge and the electrode 12 is positively charged. At the time $t_1$ the difference between the electrical potentials of the weighing object 2 and the electrode 12 has increased in comparison to the time interval $t_0$-$t_1$. This means that the attractive force between the weighing object 2 and the electrode 12 is higher than during the time interval $t_0$-$t_1$. The measurement result $m_{b1}$ is greater than the effective mass of the weighing object 2 and greater than during the time interval $t_0$-$t_1$.

3D. The weighing object 2 as well as the electrode 12 are positively charged. Consequently, the weighing object 2 and the electrode 12 repel each other. The measurement result $m_{c1}$ is smaller than the effective weight force of the weighing object 2 and smaller than during the time interval $t_0$-$t_1$.

3E. The weighing object 2 is connected to ground and the electrode 12 carries a positive electrostatic charge. The electrically grounded weighing object becomes charged by electrostatic induction, although it does not carry a charge of its own, and is therefore pulled towards the charged electrode 12 by the electrostatic attraction forces. The measurement result $m_{d1}$ is greater than the effective mass of the weighing object 2.

Time interval $t_2$-$t_3$:

3A. A negative DC voltage $U_2$ is applied to the electrode 12. Accordingly, the electrode 12 is negatively charged.

3B. The weighing object 2 carries no electrostatic charge and is not electrically connected to ground. The electrode 12 is negatively charged. There is neither an electrostatic field nor are there electrostatic forces between the weighing object and the electrode. The force-measuring cell 17 measures the true mass $m_{a0}$ of the weighing object 2.

3C. The weighing object 2 as well as the electrode 12 are negatively charged. The direction of the electrostatic force has changed. The weighing object 2 and the electrode 12 repel each other. Accordingly, the measurement result $m_{b2}$ is smaller than the effective mass of the weighing object 2 and smaller than during the time interval $t_0$-$t_1$.

3D. The weighing object 2 is positively charged and the electrode 12 is negatively charged. At the time $t_2$ the difference between the electrical potentials of the weighing object 2 and the electrode 12 has increased in comparison to the time interval $t_0$-$t_1$. This means that the attractive force between the weighing object 2 and the electrode 12 is higher than during the time interval $t_0$-$t_1$. The measurement result $m_{b2}$ is greater than the effective mass of the weighing object 2 and greater than during the time interval $t_0$-$t_1$.

3E. The weighing object 2 is connected to ground and the electrode 12 carries a negative electrostatic charge. The electrically grounded weighing object becomes charged by electrostatic induction, although it does not carry a charge of its own, and is therefore pulled towards the charged electrode 12 by the electrostatic attraction forces. If the voltages $U_1$ and $U_2$ have the same absolute values, the measurement result $m_{d1}$ remains the same as during the time interval $t_1$-$t_2$.

During the time period $t_3$-$t_4$, the same events take place as during the time period $t_1$-$t_2$.

During the time period $t_4$-$t_5$, the same events take place as during the time period $t_2$-$t_3$.

Figure 3:
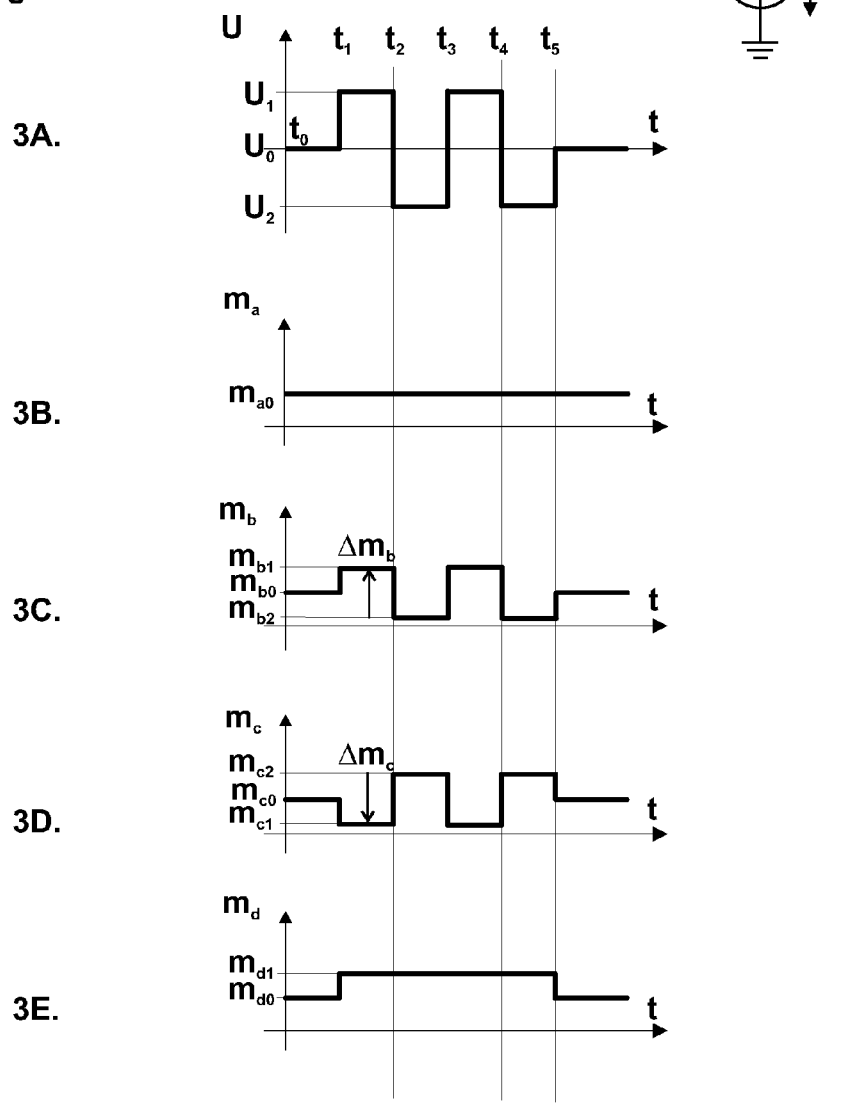
FIGS. 3A through 3E are graphs depicting the method, with FIG. 3A representing the voltage applied to the electrode as a function of time, and graphs 3B, 3C, 3D, 3E representing the measurement result obtained when weighing an object which, respectively, (3B) carries no electrostatic charge and is not connected to earth ground, (3C) carries a negative charge, (3D) carries a positive charge, and (3E) is connected to earth ground.

In the example of FIG. 3 the inventive method is performed over two successive cycles, but it could also be performed only once or over more than two cycles.

The measurement result can be affected by extraneous disturbances. By running the method repeatedly and processing the respective measurement results, it is possible to narrow the spread of the measurement results and thus to reduce the extent to which disturbances can affect the measurement of the effect of electrostatic charges. This technique is generally known under the terms "chopper stabilization" or "lock-in amplifier".

In the example of FIG. 3 the method is completed at the time $t_5$. Subsequently, the situation is the same as in the time interval $t_0$-$t_1$.

After the inventive method has been carried out, the measurement result can be correct by means of the respective values of $\Delta m_b$ and $\Delta m_c$.

Figure 4:
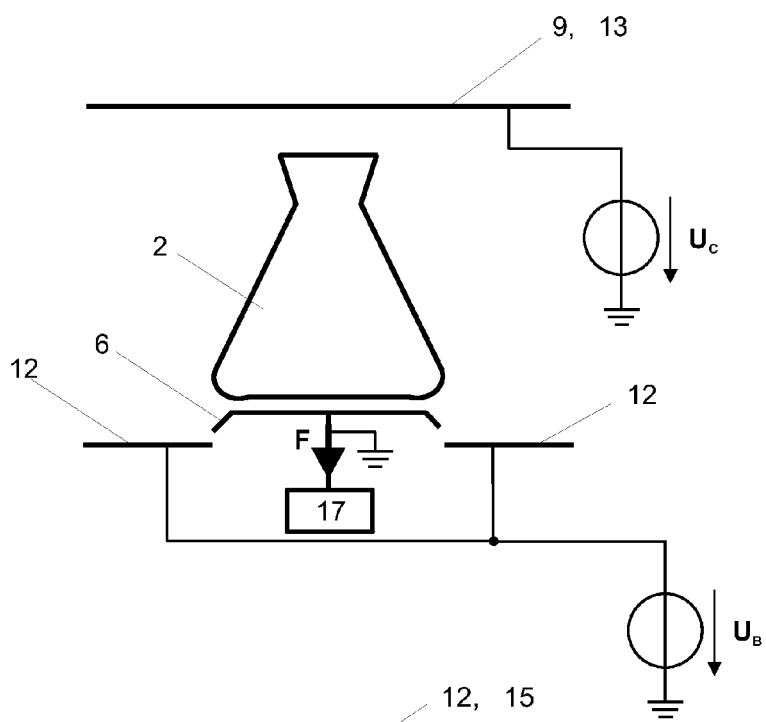
FIG. 4 is a side view of a balance with a weighing compartment floor constituting the first electrode and a weighing compartment roof constituting the second electrode.

FIG. 4 shows a balance 1 with a weighing object 2 resting on the load receiver 6. The illustrated embodiment has two electrodes 12, 13. The load receiver 6 is electrically grounded and coupled to the force-measuring cell 17.

The first electrode 12 is arranged below the load receiver 6 and has a cutout with the contour shape of the vertical projection of the load receiver 6. This electrode forms the weighing compartment floor. The cutout in the electrode 12 has the purpose to reduce unwanted electrostatic forces between the electrode and the grounded load receiver 6.

Conceivably, the balance 1 could be equipped with a first electrode 12 that is not constituted by the weighing compartment floor 7 but is configured as an additional part of the balance 1. The first electrode 12 can be flat or of some other shape. It could for example be configured as a bowl that surrounds the weighing object 2. It can cover the entire surface of the weighing compartment floor or only a part of it. The cutout can exactly match the contour shape of the vertical projection of the load receiver 6, or it can be smaller or larger. It would also be possible to configure the first electrode 12 without a cutout.

A second electrode 13 can be arranged above the weighing object 2. It forms the draft shield roof 9.

The upper electrode 13 can be flat or of some other shape. It can be part of the balance 1. It can also be configured as a hood that is arranged above the weighing object 2.

The first electrode 12 is connected to a first DC voltage source $U_B$, and the second electrode 13 is connected to a second DC voltage source $U_C$. It is advantageous if the respective voltages applied to the electrodes 12 and 13 have opposite polarities.

Figure 5:
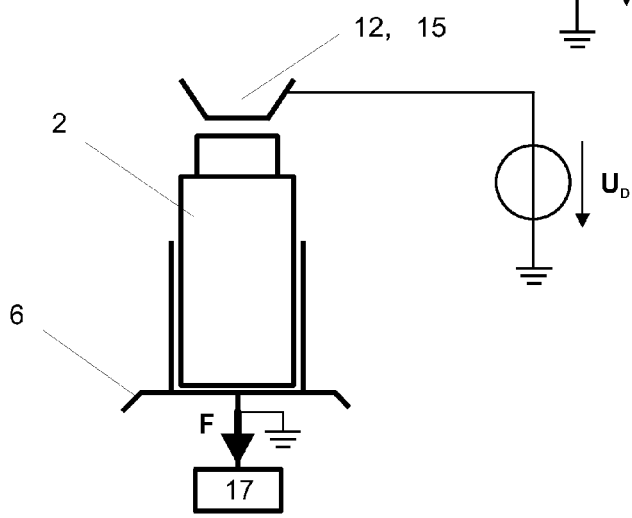
FIG. 5 is a side view of a dosage-dispensing device with a dispensing head constituting the first electrode.

FIG. 5 shows a weighing object 2 in the form of a container seated on a balance 1 and a dosage-dispensing head 15 to fill the container with a substance.

The dosage-dispensing head 15, which serves to dispense a controlled quantity of substance into the container, is arranged above the weighing object 2 and constitutes the electrode 12. It is connected to a voltage source $U_D$. This embodiment has the advantage that because of the proximity of the dosage-dispensing head 15 and the container opening (of the weighing object 2) the electrostatic forces are concentrated predominantly in this area.

The load receiver 6 is designed to receive the weighing object 2 in a fixed and reproducibly defined position. The load receiver 6 is electrically grounded. Due to the defined position, it is possible to perform weighings under comparable measurement conditions in regard to the influence of electrostatic effects. One advantage of having repeatable measurement conditions is that a correction for the errors in the measurement values which are caused by electrostatic charges 5 on the weighing object 2 can be determined empirically.

Figure 6:
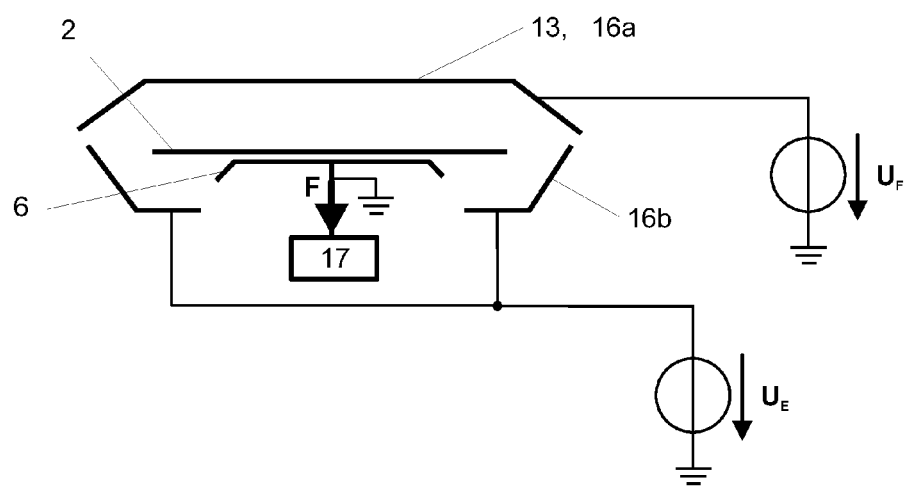
FIG. 6 is a side view of a balance with a filter and a filter-weighing chamber, wherein the bottom part of the filter-weighing chamber is used as the first electrode and the top part of the filter-weighing chamber is used as the second electrode.

FIG. 6 illustrates a balance 1 with a particle filter constituting the weighing object 2 and with a filter-weighing chamber 16a, 16b. The filter rests on the load receiver 6 which is coupled to the force-measuring cell 17. The filter-weighing chamber 16a, 16b consists of two parts 16a, 16b, i.e. a top part 16a and a bottom part 16b. The bottom part forms the first electrode 12, and the top part forms the second electrode 13. Both electrodes 12, 13 are galvanically isolated. The first electrode 12 is arranged below the filter and is connected to a first DC voltage source $U_E$. The second electrode 13 is arranged above the filter and is connected to a second DC voltage source $U_F$.

Particle filters are poor conductors of electricity and are therefore particularly susceptible to electrostatic charges. Because of the horizontal position of the filter surface, the electrostatic charges 5 on the filter have a significant influence on the weighing result. The charges 5 on the filter act in two opposite directions. It is therefore advantageous to configure the filter-weighing chamber with the electrodes 12, 13 in two parts that cover, respectively, the bottom side and the top side of the filter. With this arrangement, the main portion of the effect that the electrostatic charges 5 have on the weighing result becomes measurable.

The present invention is of particular advantage in the weighing of filters as well as other flat weighing objects.

What is claimed is:

1. A method of estimating an effect of an electrostatic charge on the result of weighing an object on a balance comprising a force-measuring cell and a load receiver on which the object is placed, the method comprising the steps of:
applying, to a first electrode that is arranged in the vicinity of the object, a first predefined voltage, measuring a first force acting on the force-measuring cell while applying the first predefined voltage, and registering the measured first force as a first measurement result;
applying, to the first electrode, a second predefined voltage that is, relative to the first predefined voltage, equal in absolute magnitude and opposite in polarity, measuring a second force acting on the force-measuring cell while applying the second predefined voltage, and registering the measured second force as a second measurement result;
generating a signal by calculating a difference between the respective first and second measurement results, the signal having a magnitude that represents the influence on the weighing result caused by the electrostatic charge; and
sending the generated signal to a processor unit.

2. The method of claim 1, wherein:
the generated signal indicates the polarity of the electrostatic charge, based upon the algebraic sign of the calculated difference.

3. The method of claim 2, further comprising the step of:
sending, based upon the generated signal, at least one output signal from the processor unit to at least one of: an indicator unit of the balance and an ionizer.

4. The method of claim 3, wherein:
the at least one output signal from the processor comprises at least one of: a polarity value and a value of an absolute magnitude, the absolute magnitude value being proportional to the difference between the respective first and second measurement results.

5. The method of claim 4, wherein:
the at least one output signal from the processor comprises information about the measures to be taken to do at least one of:
draining off the electrostatic charge; and
screening the object.

6. The method of claim 1, further comprising the steps of:
obtaining a weighing result by measuring a force acting on the force-measuring cell while no voltage is applied to the first electrode; and
correcting the obtained weighing result, using a predefined correction factor and the difference between the respective first and second measurement results.

7. The method of claim 1, wherein:
the position, the dimension, the material and the form of the object are held constant over the course of a measurement series.

8. The method of claim 6, further comprising the step of:
displaying the corrected weighing result on the indicator unit.

9. The method according to claim 3, further comprising:
delivering a status signal to the indicator unit, the status signal indicating the current status of the method, differentiating at least between the method being in progress and the method being completed.

10. The method of claim 1, further comprising the step of:
sending, based upon the generated signal, at least one output signal from the processor unit to at least one of: an indicator unit of the balance and an ionizer.

11. The method of claim 10, further comprising the steps of:
obtaining a weighing result by measuring a force acting on the force-measuring cell while no voltage is applied to the first electrode; and
correcting the obtained weighing result, using a predefined correction factor and the difference between the respective first and second measurement results.

12. A balance for estimating an effect on a weighing result of an object being weighed on a load receiver of the balance, the effect caused by an electrostatic charge on the object, the balance comprising:
a first fixed element in the nature of an electrode, arranged in the vicinity of the weighing object and of the load receiver.

13. The balance of claim 12, further comprising:
a second fixed element in the nature of an electrode, each of the fixed elements having an essentially flat, planar shape.

14. The balance of claim 13, wherein:
at least one of the fixed elements is arranged below the weighing object and the load receiver.

15. The balance of claim 14, further comprising:
a weighing compartment having a floor; and
wherein each of the at least one fixed elements has a cutout with a shape contoured to a vertical projection of the load receiver onto the floor.

16. The balance of claim 13, wherein:
the fixed elements are arranged with one oriented essentially orthogonal to the direction of gravity and the other oriented either essentially orthogonal to the direction of gravity or in the direction of gravity.

17. The balance of claim 13, further comprising:
a weighing compartment having a floor and, optionally, a draft shield having a roof and walls,
wherein at least one of the floor and the draft shield roof and the walls are used, either in their entirety or in part, as at least one of the fixed elements.

18. A method of estimating an effect of an electrostatic charge on the result of weighing an object on a balance comprising a force-measuring cell and a load receiver on which the object is placed, the method comprising the steps of:
applying, to a first electrode that is arranged in the vicinity of the object, a first predefined voltage, measuring a first force acting on the force-measuring cell while applying the first predefined voltage, and registering the measured first force as a first measurement result;
applying, to the first electrode, a second predefined voltage that is, relative to the first predefined voltage, equal in absolute magnitude and opposite in polarity, measuring a second force acting on the force-measuring cell while applying the second predefined voltage, and registering the measured second force as a second measurement result;
generating a signal by calculating a difference between the respective first and second measurement results, the signal having a magnitude that represents the influence on the weighing result caused by the electrostatic charge; and
sending the generated signal to a processor unit, while delivering a status signal to an indicator unit of the balance, the status signal causing the indicator unit to display a message indicating that the method is in progress;
obtaining a weighing result by measuring a force acting on the force-measuring cell while no voltage is applied to the first electrode;
correcting the obtained weighing result, using a predefined correction factor and the calculated difference between the respective first and second measurement results; and
displaying the corrected weighing result on the indicator unit.

\* \* \* \* \*